United States Patent [19]

Shimada et al.

[11] Patent Number: 5,355,027

[45] Date of Patent: Oct. 11, 1994

[54] SHIFT REGISTER CIRCUIT WITH THREE-INPUT NOR GATES IN SELECTOR CIRCUIT

[75] Inventors: Masaaki Shimada; Norio Higashisaka; Akira Ohta, all of Itami, Japan

[73] Assignee: Mitsubishi Denki Kabushiki Kaisha, Tokyo, Japan

[21] Appl. No.: 42,506

[22] Filed: Apr. 5, 1993

Related U.S. Application Data

[63] Continuation-in-part of Ser. No. 11,236, Jan. 29, 1993, abandoned.

[30] Foreign Application Priority Data

Feb. 4, 1992 [JP] Japan .................. 4-019118
Dec. 25, 1992 [JP] Japan .................. 4-359688

[51] Int. Cl.$^5$ .................. H03K 3/286; H03K 19/20
[52] U.S. Cl. .................. 307/247.1; 307/272.2; 307/445; 377/73
[58] Field of Search .................. 307/243, 291, 510, 511, 307/518; 328/104, 154; 377/70, 73, 111

[56] References Cited

U.S. PATENT DOCUMENTS 3,666,930  5/1972  McDaniel .................. 307/243
3,932,816  1/1976  MacGregor .................. 307/243
4,481,623  11/1984  Clark .................. 307/243

Primary Examiner—Timothy P. Callahan
Assistant Examiner—Shawn Riley
Attorney, Agent, or Firm—Leydig, Voit & Mayer

[57] ABSTRACT

A shift register circuit includes a first two-input NOR circuit to which a first data signal and a selection signal are input, a second two-input NOR circuit to which a first reverse data signal having an opposite phase from the first data signal and the selection signal are input, a third two-input NOR circuit to which a second data signal and a reverse selection signal having an opposite phase from the selection signal are input, a fourth two-input NOR circuit to which a second reverse data signal having an opposite phase from the second data signal and the reverse selection signal are input, a first three-input NOR circuit to which output signals from the first and third two-input NOR circuits and the clock signal are input, and a second three-input NOR circuit to which output signals from the second and fourth two-input NOR circuits and the clock signal are input. Since the three-input NOR circuits are employed, the number of NOR circuits through which the input data signal travels is decreased, resulting in an increase in the operation speed of the shift register circuit.

5 Claims, 8 Drawing Sheets

SHIFT REGISTER CIRCUIT WITH THREE-INPUT NOR GATES IN SELECTOR CIRCUIT

This disclosure is a continuation-in-part of U.S. patent application Ser. No. 08/011,236 filed Jan. 29, 1993, now abandoned.

FIELD OF THE INVENTION

The present invention relates to a shift register circuit constituting one bit (one stage) of a multiple-bit shift register and, more particularly, to a shift register circuit that converts input parallel data to serial output data.

BACKGROUND OF THE INVENTION

FIG. 6 is a circuit diagram illustrating a conventional parallel-input and series-output type shift register circuit. This shift register circuit consists of selector circuits 41 and 42 and a D flip-flop circuit 43. The selector circuit 41 consists of two-input NOR gates 1, 3, and 5, and the selector circuit 42 consists of two-input NOR gates 2, 4, and 6. The D flip-flop circuit 43 consists of two-input NOR gates 7 to 14. Thus, the conventional shift register circuit consists of fourteen two-input NOR gates 1 to 14.

Reference characters A, B, /A, and /B designate input data, C and /C output data, S and /S selection signals, and CK and /CK clock signals. The phase differences between A and /A, B and /B, C and /C, S and /S, CK and /CK are respectively 180°.

Since each of the two-input NOR gates 1 to 14 is a DCFL (Direct Coupled FET Logic) circuit, each NOR gate consists of three MESFETs (Metal Semiconductor FET) as shown in FIG. 8.

A description is given of the operation.

When the logic value of the selection signal S is "1" and the logic value of the reverse selection signal /S is "0", "0" is attained at the output node N13 of the NOR gate 3 to which the selection signal S is applied, and reverse data /A is attained at the output node N11 of the NOR gate 1 to which the reverse selection signal /S is applied because the input data A applied to the NOR gate 1 is reversed. Then, data A is attained at the output node N21 of the NOR gate 5 because the reverse data /A input to the NOR gate 5 is reversed. The data A thus selected in the selector circuit 41 is input to the NOR gate 7 of the D flip-flop circuit 43. During the process in the selector circuit 41, the input data A passes through two NOR gates 1 and 5.

When the logic value of the clock signal CK which drives the D flip-flop circuit 43 is "0", reverse data /A is attained at the output node N31 because the data A input to the NOR gate 7 is reversed. The reverse data /A from the NOR gate 7 is reversed twice while passing through the NOR gates 9 and 10, and reverse data /A is attained at the output node N42 of the NOR gate 10. During the process, the data passes through three NOR gates 7, 9, and 10. At this time, since the logic value of the reverse clock signal /CK is "1", "0" is attained at the output nodes N51 and N52 of the NOR gates 11 and 12, so that outputs from the NOR gates 13 and 14 constituting the flip-flop, i.e., the output data C and /C from the shift register circuit, hold the present output values.

When the logic value of the reverse clock signal /CK is "0", the reverse data /A from the NOR gate 10 is reversed in the NOR gate 12 and data A is attained at the output node N52. Then, the data A is reversed twice while passing through the NOR gates 14 and 13, so that data A is output from the NOR gate 13 as the output data C from the shift register circuit. During the process, the data passes through three NOR gates 12, 14, and 13.

The process from inputting the reverse input data /A to outputting the reverse output data /C is identical to the process described above.

In the conventional shift register circuit, the input data A (/A) has to pass through eight NOR gates until it is output as the output data C (/C).

When the logic value of the selection signal S is "0" and the logic value of the reverse selection signal /S is "1", the input data B is output as the output data C and the reverse input data /B is output as the reverse output data /C. Also in this case, the input data B (/B) has to pass through eight NOR gates until it is output as the output data C (/C).

In the coventional shift register circuit, either of the input data A and B (/A and /B) is selected by the selection signal S (/S), and the selected data is synchronized with the clock signal CK (/CK) to attain the output data C (/C).

FIG. 5 is a circuit diagram illustrating a conventional four-bit shift register circuit which is achieved by connecting three shift register circuits shown in FIG. 6 in series. In FIG. 5, reference numeral 31 designates a D flip-flop circuit, and numerals 32, 33, and 34 designate shift register circuits. Reference characters D1, /D1, D2, /D2, D3, /D3, D4, and /D4 are input parallel data, and characters D0 and /D0 designate output serial data. The phase differences between D1 and /D1, D2 and /D2, D3 and /D3, D4 and /D4 are respectively 180°.

The operation of the shift register circuit will be described using FIGS. 5, 6, and 7.

For example, the input parallel data D3 is input to the shift register circuit 33 and synchronized with the clock signal CK, and then it is output to the shift register circuit 34. At this time, the data D3 taken in the flip-flop circuit 43 due to the fall of the clock CK is delayed by two NOR gates at the output node N21. Then, the data D3 at the output node N21 is synchronized and latched due to the fall of the clock signal /CK and appears at the output node N41. At this time, the data is delayed by three NOR gates. The data at the node N41 is synchronized and latched due to the fall of the reverse clock signal /CK and, thereafter, it is output as the output data D0 which is further delayed by three NOR gates. In this way, the data D3 input to the shift register circuit 34 has been delayed by eight NOR gates in total when it is output as the output serial data D0.

As described above, since the input parallel data is synchronized with the clock signal CK in each shift register circuit, the delay time ($t_1 + t_2$) of the data in the shift register circuit has to be within a time interval equivalent to one cycle (T) of the clock signal CK, i.e., $t_1 + t_2$ has to be shorter than T (refer to FIG. 7). In other words, the delay time of the data in the conventional shift register circuit is equivalent to the delay time of eight two-input NOR gates, so that the time interval equivalent to the cycle T must be longer than the delay time of eight two-input NOR gates in order to operate the shift register circuit normally. Therefore, it is difficult to increase the operation speed of the shift register circuit.

SUMMARY OF THE INVENTION

It is an object of the present invention to provide a shift register circuit that operates normally even if the time interval equivalent to one cycle of the clock is shorter than the delay time of eight two-input NOR gates when a plurality of the shift register circuits are connected in series to achieve a multiple-bit shift register circuit.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to a first aspect of the present invention, in a shift register circuit, a gate circuit, through which an input data signal passes to become an output data signal, includes six two-input NOR gates and one three-input NOR gate. In this structure, the delay time of the data signal in the shift register is equal to the sum of the delay time of six two-input NOR gates and one three-input NOR gate. Therefore, the number of the NOR gates through which the data signal passes is decreased, so that normal operation is achieved with a high-speed clock signal when a plurality of the shift register circuits are connected in series to achieve a multipe-bit shift register circuit.

According to a second aspect of the present invention, in a shift register circuit, a gate-circuit, through which an input data signal passes to become an output data signal, comprises four two-input NOR gates and two three-input NOR gates. In this structure, the delay time of the data signal in the shift register is equal to the sum of the delay time of four two-input NOR gates and two three-input NOR gates. Therefore, the number of NOR gates through which the data signal passes is decreased, so that normal operation is achieved with a high-speed clock signal when a plurality of shift register circuits are connected in series to achieve a multipe-bit shift register circuit.

DETAILED DESCRIPTION OF THE PREFERRED EMBODIMENTS

Figure 1:
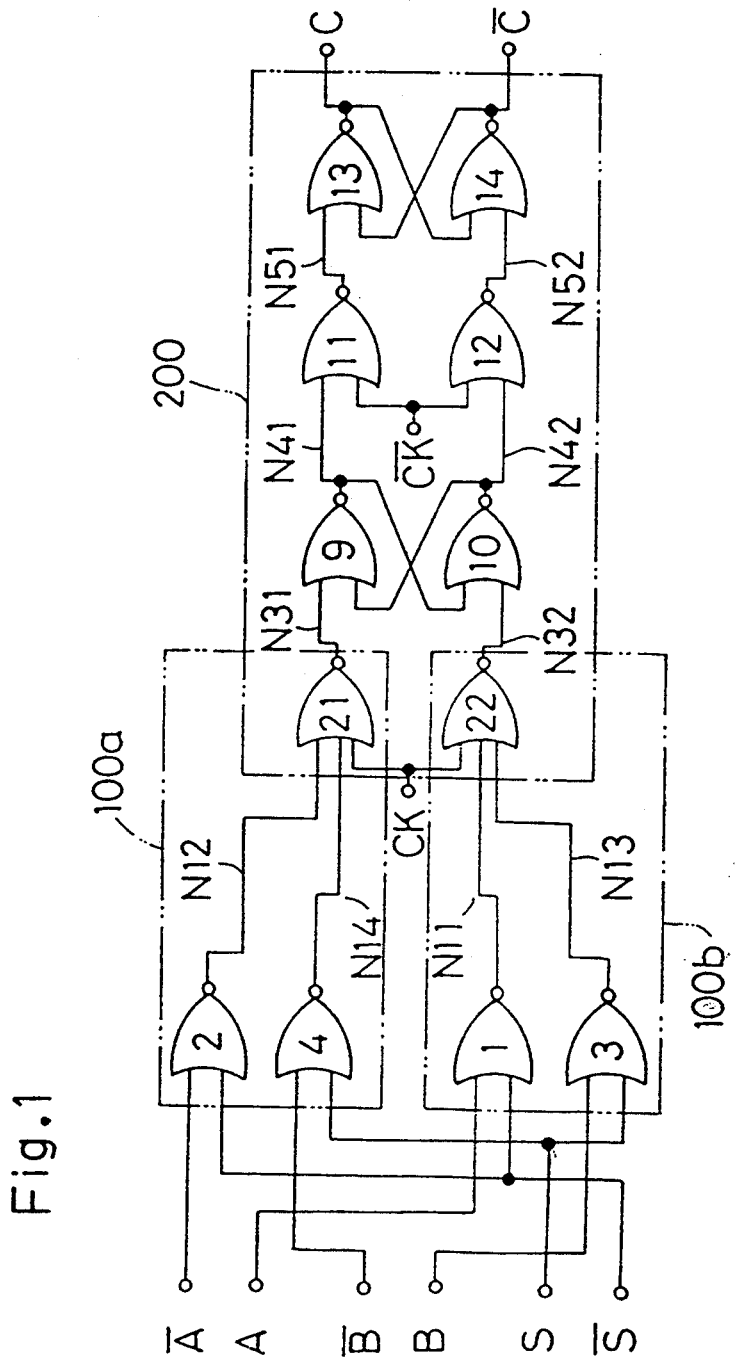
FIG. 1 is a circuit diagram illustrating a shift register circuit in accordance with a first embodiment of the present invention.

FIG. 1 is a circuit diagram illustrating a shift register circuit in accordance with a first embodiment of the present invention, which converts input parallel data to serial data. In the conventional shift register circuit described above output signals from the two-input NOR gates 1 and 3 are input to the two-input NOR gate 7 through the two-input NOR gate 5 and output signals from the two-input NOR gates 2 and 4 are input to the two-input NOR gate 8 through the two-input NOR gate 6. In this first embodiment the two-input NOR gates 5 and 6 are removed and three-input NOR gates 21 and 22 are employed in place of the two-input NOR gates 7 and 8.

In the shift register circuit of FIG. 1, output signals from the two-input NOR gates 2 and 4 and the clock signal CK are input to the three-input NOR gate 21, and an output signal from the three-input NOR gate 21 is input to the two-input NOR gate 9. Similarly, output signals from the two-output NOR gates 1 and 3 and the clock signal CK are input to the three-input NOR gate 22, and an output signal from the three-input NOR gate 22 is input to the two-input NOR-gate 10. In this structure, a selector circuit 100a includes the two-input NOR gates 2 and 4 and the three-input NOR gate 21, and a selector circuit 100b includes the two-input NOR gates 1 and 3 and the three-input NOR gate 22. A D flip-flop circuit 200 includes the three-input NOR gates 21 and 22 and the two-input NOR gates 9 to 14.

The two-input NOR gates 1 to 4 and 9 to 14 and the three-input NOR gates 21 and 22 are by DCFL (Direct Coupled FET Logic) circuits. The total number of the NOR gates included in the shift register circuit of this first embodiment is twelve, i.e., ten two-input NOR gates and two three-input NOR gates. That is, two NOR gates can be dispensed with as compared with the conventional shift register including fourteen NOR gates.

When each of the NOR gates is a DCFL circuit, three MESFETs are used in each two-input NOR gate, and four MESFETs are used in each three-input NOR gate. Accordingly, the total number of MESFETs needed for the shift register circuit of this embodiment is thirty eight (=3×10+4×2) while forty two (=3×14) MESFETs are needed for the conventional shift register circuit. Since the power consumption of the two-input NOR gate is equivalent to that of the three-input NOR gate in the DCFL circuits; four (=42−38) MESFETs' power consumption is eliminated. In addition, the size of the shift register circuit is reduced.

A description is given of the operation.

For example, when the logic value of the selection signal S is "1" and the logic value of the reverse selection signal /S is "0", "0" is attained at the output node N13 of the NOR gate 3 to which the selection signal S is applied, and reverse data /A is attained at the output node N11 of the NOR gate 1 to which the reverse selection signal /S is applied because the input data A applied to the NOR gate 1 is reversed.

Similarly, "0" is attained at the output node N14 of the NOR gate 4 to which the selection signal S (logic value "1") is applied, and data A is attained at the output node N12 of the NOR gate 2 to which the reverse selection signal /S (logic value "0") is applied because the reverse data /A input to the NOR gate 2 is reversed. In this way, input data A and /A are selected.

The three-input NOR gate 21 receives output data from the nodes N12 and N14 and the clock signal CK. At this time, if the logic value of the clock signal CK is "0", reverse data /A is attained at the output node N31 of the three-input NOR gate 21. If the logic value of the clock signal CK is "1", "0" is attained at the output node N31.

Similarly, the three-input NOR gate 22 receives the reverse input data /A from the NOR gate 1, the logic value "0" from the NOR gate 3, and the clock signal CK. At this time, if the logic value of the clock signal CK is "0", data A is attained at the output node N32 of the NOR gate 22. If the logic value of the clock signal CK is "1", "0" is attained at the output node N32.

The reverse data /A at the output node N31 of the NOR gate 21 is reversed twice while passing through the NOR gates 9 and 10 of the flip-flop circuit, and reverse data /A is attained at the output node N42 of the NOR gate 10. The data A at the output node N32 of the NOR gate 22 is reversed twice while passing through the NOR gates 10 and 9, and data A is attained at the output node N41 of the NOR gate 9.

At this time, since the logic value of the reverse clock signal /CK is "1", "0" is attained at the output nodes N51 and N52 of the NOR gates 11 and 12, respectively, and output data from the NOR gates 13 and 14, i.e., output data C and /C from the shift register circuit, hold the present values.

When the logic value of the clock signal CK is "1" and the logic value of the reverse clock signal /CK is "0", "0" is attained at the output nodes N31 and N32 of the NOR gates 21 and 22, and the output nodes N41 and N42 of the NOR gates 9 and 10 hold the present data, i.e., data A and reverse /A, respectively.

At this time, since the logic value of the reverse clock signal /CK is "0", reverse data /A is attained at the output node N51 of the NOR gate 11 to which the data A from the NOR gate 9 and the reverse clock signal /CK are applied, and data A is attained at the output node N52 of the NOR gate 12 to which the reverse data /A from the NOR gate 10 and the reverse clock signal /CK are applied.

The data A at the output node N52 of the NOR gate 12 is reversed twice while passing through the NOR gates 14 and 13 of the flip-flop circuit, so that data A is output from the NOR gate 13 as the output data C of the shift register circuit. The reverse data /A at the output node N51 of the NOR gate 11 is reversed twice while passing through the NOR gates 13 and 14, so that reverse data /A is output from the NOR gate 14 as the output /C of the shift register circuit. Thus, the input data A (/A) passes through six two-input NOR gates and one three-input NOR gate until it is output as the output data C (/C).

Similarly, when the logic value of the selection signal S is "0" and the logic value of the reverse selection signal /S is "1", "0" is attained at the output nodes N11 and N12 of the NOR gates 1 and 2, and reverse input data /B is attained at the output node N13 of the NOR gate 3 because the input data B applied to the NOR gate 3 is reversed, and data B is attained at the output node N14 of the NOR gate 4 because the input reverse data /B applied to the NOR gate 4 is reversed.

Thereafter, in the same manner as described with respect to the input data A and /A, thus selected input data B or /B is synchronized with the clock signal CK or /CK and output from the shift register circuit as output data C or /C.

Figure 2:
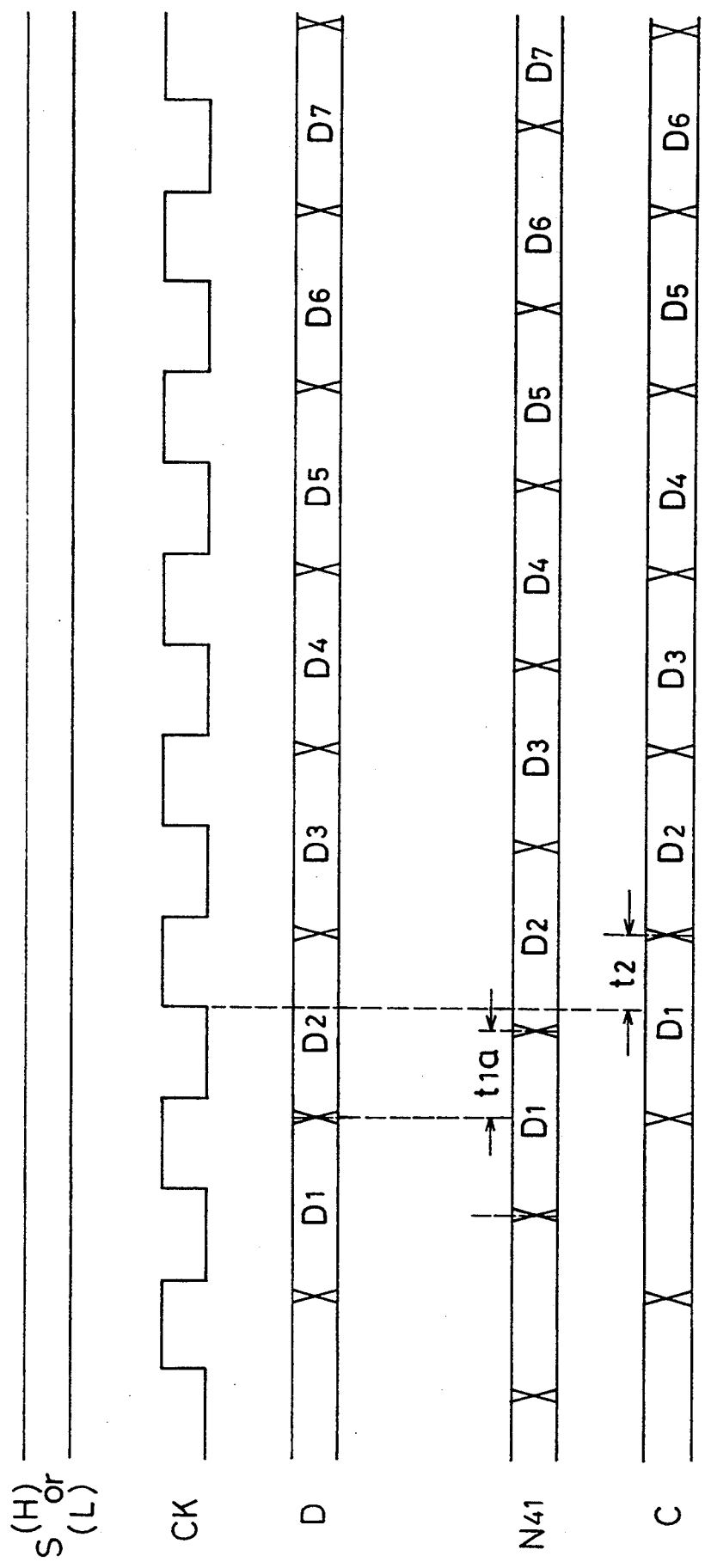
FIG. 2 is a waveform diagram for explaining the operation of the shift register circuit of FIG. 1.
Figure 5:
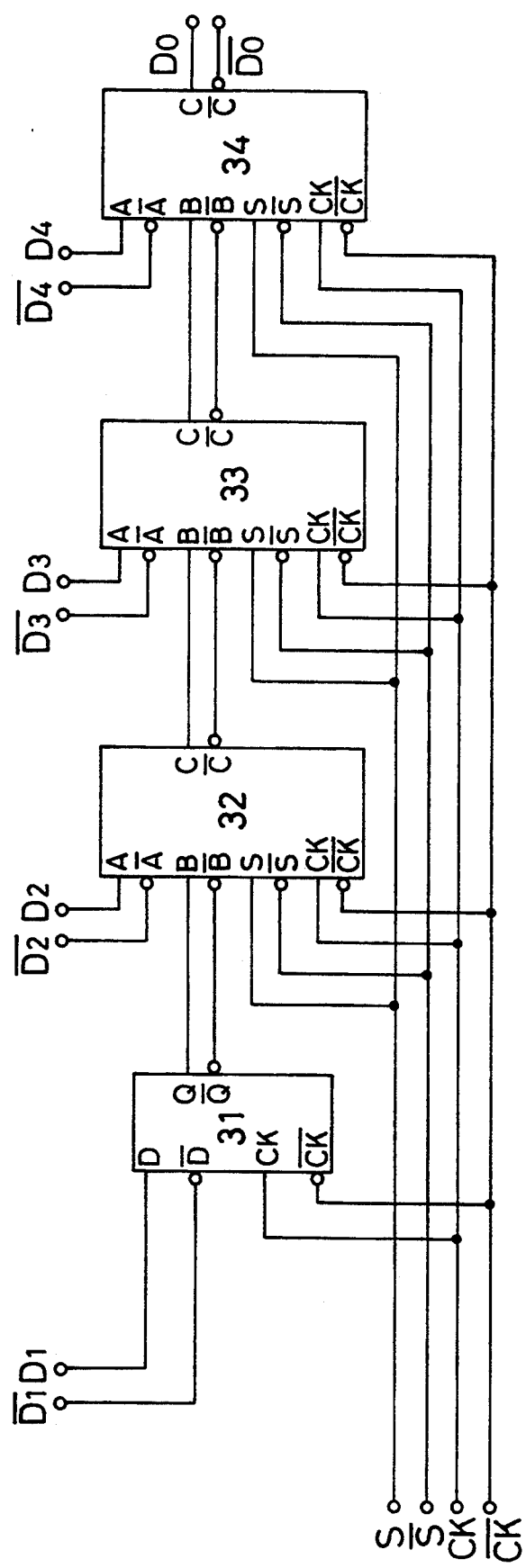
FIG. 5 is a circuit diagram illustrating a conventional four-bit shift register circuit.

According to the first embodiment of the present invention, each of the input data A, /A, B, and /B is output through six two-input NOR gates and one three-input NOR gate. When the four-bit shift register circuit of FIG. 5 is fabricated using three shift register circuits connected in series, since the three-input NOR gates 21 and 22 serve both as the latter-stage logic gates of the selector circuits 100a and 100b, respectively, and as the initial stage logic gates for synchronization of the D flip-flop circuit 200, the input data at the output node N41 is subjected to a delay caused by four NOR gates, i.e., three two-input NOR gates and one three-input NOR gate. As the result, the delay time of the whole circuit is reduced by the delay time of one NOR gate as compared with the conventional shift register circuit. Accordingly, the shift register circuit of this embodiment operates normally if the cycle (T) of the clock signal CK is longer than the sum of the delay time of six two-input NOR gates and one three-input NOR gates ($t_{1a}+t_2$) as shown in FIG. 2. In FIG. 2, reference character D designates the input data A or B.

Generally, the delay time of the three-input NOR gate is little longer than the delay time of the two-input NOR gate. For example, if it is supposed that the delay time of one two-input NOR gate is 50 ps and the delay time of one three-input NOR gate is 60 ps, the total delay time of the four-bit shift register of FIG. 5 is 400 ps ($=50\times 8$) when it consists of the conventional shift register circuits of FIG. 6 while it is 360 ps ($50\times 6+60\times 1$) with the four-bit shift register circuits of this embodiment.

Figure 6:
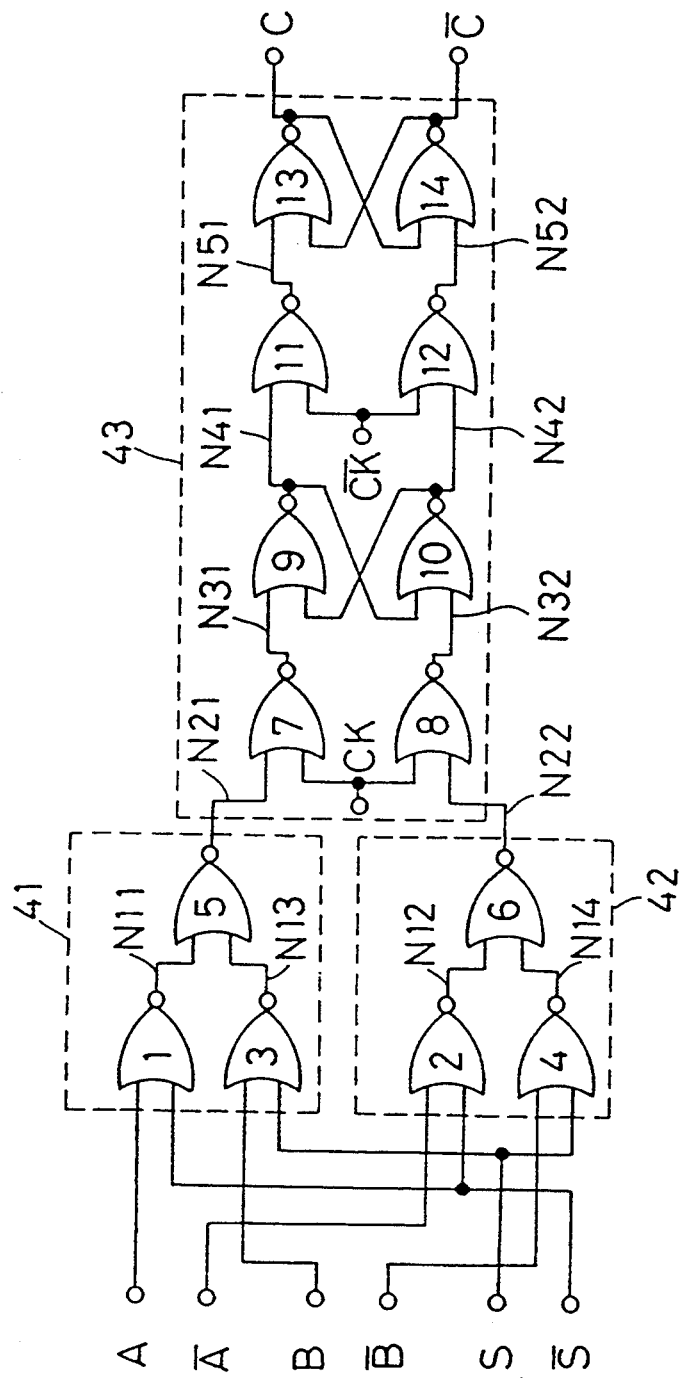
FIG. 6 is a circuit diagram illustrating a shift register circuit in accordance with the prior art.
Figure 7:
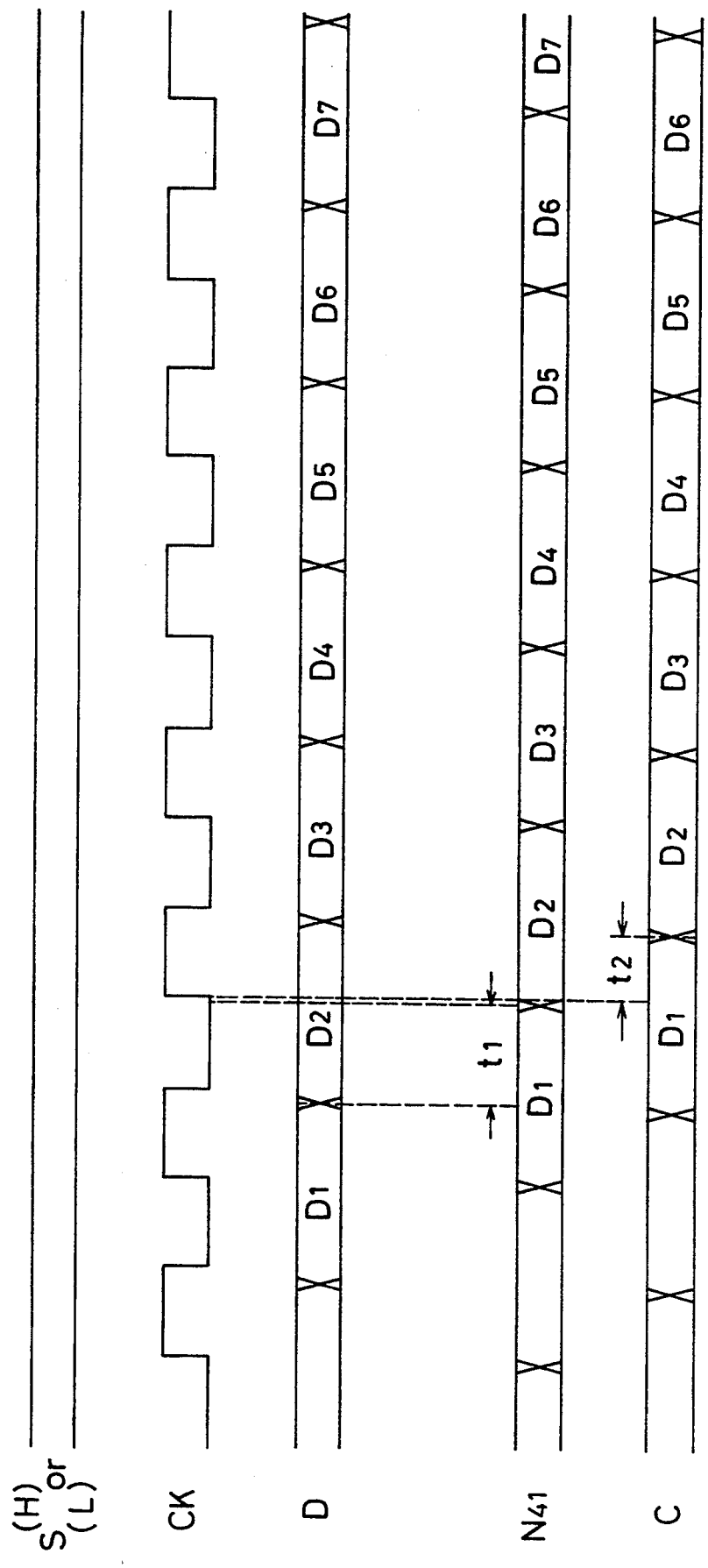
FIG. 7 is a waveform diagram for explaining the operation of the shift register circuit of FIG. 6.
Figure 8:
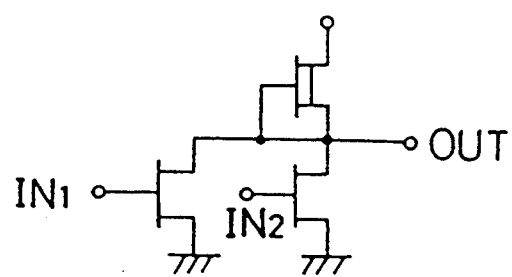
FIG. 8 is a circuit diagram illustrating a two-input NOR gate included in the shift register circuit of FIG. 6.

Accordingly, although the conventional shift register circuit of FIG. 6 requires a cycle (T) of the clock signal CK to be longer than 400 ps for normal operation, the shift register circuit of this embodiment only requires that the cycle be longer than 360 ps, resulting in an increase in the operation speed by about 10 percent.

Figure 3:
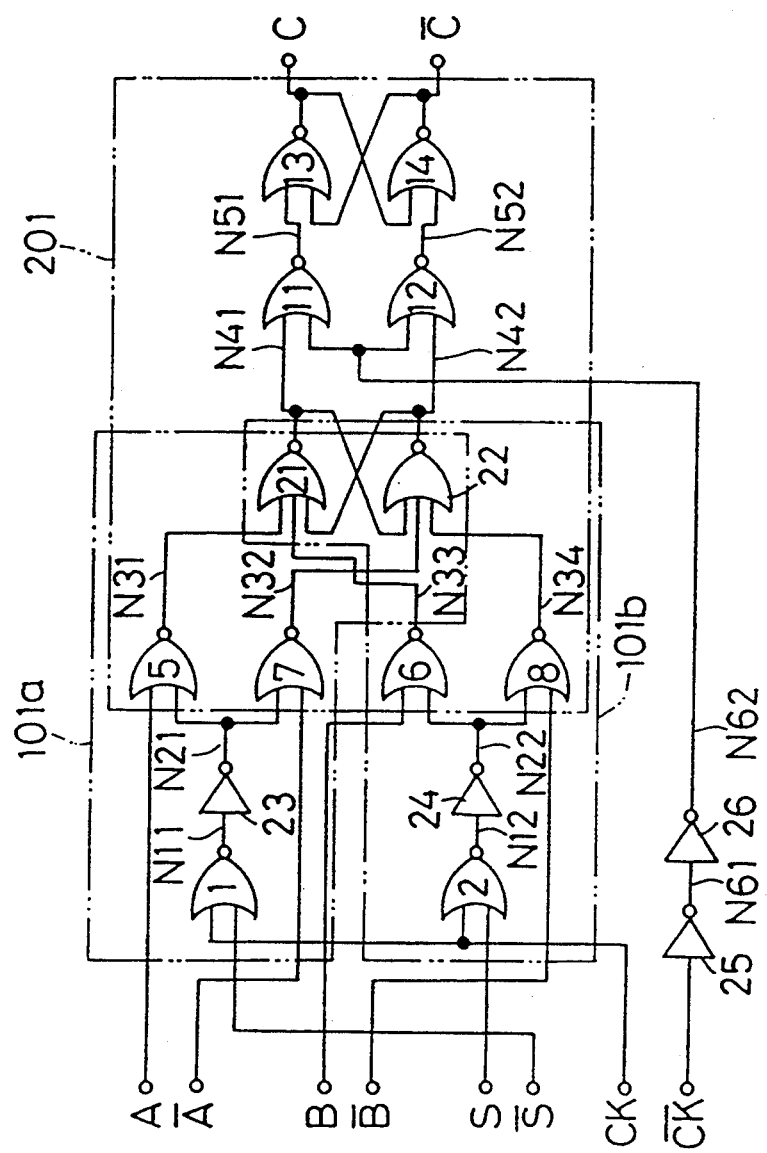
FIG. 3 is a circuit diagram illustrating a shift register circuit in accordance with a second embodiment of the present invention.

FIG. 3 is a circuit diagram illustrating a shift register circuit in accordance with a second embodiment of the present invention. In this second embodiment, the shift register circuit comprises ten two-input NOR gates 1, 2, 5, 6, 7, 8, 11, 12, 13, and 14, two three-input NOR gates 21 and 22, and four inverters 23 to 26. The input data A is applied to one input of the two-input NOR gate 5, and the reverse input data /A is applied to one input of the two-input NOR gate 7. Output signals from the NOR gates 5 and 7 are input to the three-input NOR gates 21 and 22 through the nodes N31 and N32, respectively. The input data B is applied to one input of the two-input NOR gate 6, and the reverse input data /B is applied to one input of the two-input NOR gate 8. Output signals from the NOR gates 6 and 8 are input to the three-input NOR gates 21 and 22 through the nodes N33 and N34. The clock signal CK is applied to one input of the two-input NOR gate 1 and the reverse selection signal /S is applied to the other input of the NOR gate 1. The clock signal CK is applied to one input of the two-input NOR gate 2 and the selection signal S is applied to the other input of the NOR gate 2. Output signals from the two-input NOR gates 1 and 2 are respectively input to the two-input NOR gates 5 and 7 and the two-input NOR gates 6 and 8 through the inverters 23 and 24. The reverse clock signal /CK is applied to one input of each of the two-input NOR gates 11 and 12 through the inverters 25 and 26, respectively.

A selector circuit 101a includes of the two-input NOR gates 1, 5, and 7, the three-input NOR gates 21 and 22, and the inverter 23. A selector circuit 101b includes the two-input NOR gates 2, 6, and 8, the three-input NOR gates 21 and 22, and the inverter 24. A D flip-flop circuit 200 includes the two-input NOR gates 5 to 8 and 11 to 14, and the three-input NOR gates 21 and 22. The inverters 23 to 26 may be DCFL circuits as may be the other gate circuits.

When the logic value of the selection signal S is "1" and the logic value of the reverse selection signal /S is "0", the shift register circuit of FIG. 3 operates as follows.

Since the logic value of the selection signal S is "1", "0" is attained at the output node N12 of the NOR gate 2, and "1" is attained at the output node N22 of the inverter 24. Accordingly, "0" is attained at the respective output nodes N33 and 34 of the NOR gates 6 and 8 which are connected to the output node N22.

Since the logic value of the reverse selection signal /S is "0", a reverse clock signal /CK is attained at the output node N11 of the NOR gate 1 to which the clock signal CK is applied. Then, the reverse clock signal /CK passes through the inverter 23, and the clock signal CK is attained at the output node N21.

When the logic value of the clock signal CK is "0", reverse data /A is attained at the output node N31 of the NOR gate 5 to which the input data A is applied. Then, the reverse data /A at the output node N31 is reversed twice while passing through the three-input NOR gates 21 and 22, so that the reverse data /A is attained at the output node N42 of the NOR gate 22.

On the other hand, the clock signal CK is attained at the output node N61 of the inverter 25 to which the reverse clock signal /CK is input because the reverse clock signal /CK is reversed in the inverter 25. Then, the clock signal CK is reversed by the inverter 26 and the reverse clock signal /CK is attained at the output node N62. At this time, the phase difference between the node N12 and the node N62 is approximately 180° due to the two inverters 25 and 26, and the clock signal CK input to the three-input NOR gate 21 (22) is subjected to a delay equivalent to a delay of the clock signal CK due to the two-input NOR gate 2, the inverter 24, and the two-input NOR gate 6 (the two-input NOR gate 1, the inverter 23, and the two-input NOR gate 7), whereby the phase difference in the clock signals is reduced, resulting in high-speed operation.

When the logic value of the reverse clock signal /CK at the output node N62 is "0", the reverse data /A at the node N42 is reversed by the two-input NOR gate 12, and the data A is attained at the output node N52 of the NOR gate 12. Then, the data A at the node N52 is reversed twice while passing through the two-input NOR gates 14 and 13, so that the data A is output from the NOR gate 13 as the output data C of the shift register circuit.

The process from the input of the reverse data /A to the NOR gate 7 to the output of the reverse output data /C from the NOR gate 7 is identical to the process described above. Accordingly, the input data A (/A) input to the shift register circuit passes through four two-input NOR gates and two three-input NOR gates until it is output as the output data C (/C).

Similarly, when the logic value of the selection signal S is "0" and the logic value of the reverse selection signal /S is "1", the input data B is output from the shift register as the output data C, and the reverse output data /B is output as the reverse output data /C. Also in this case, the input data B (/B) input to the shift register circuit passes through four two-input NOR gates and two three-input NOR gates until it is output as the output data C (/C).

Figure 4:
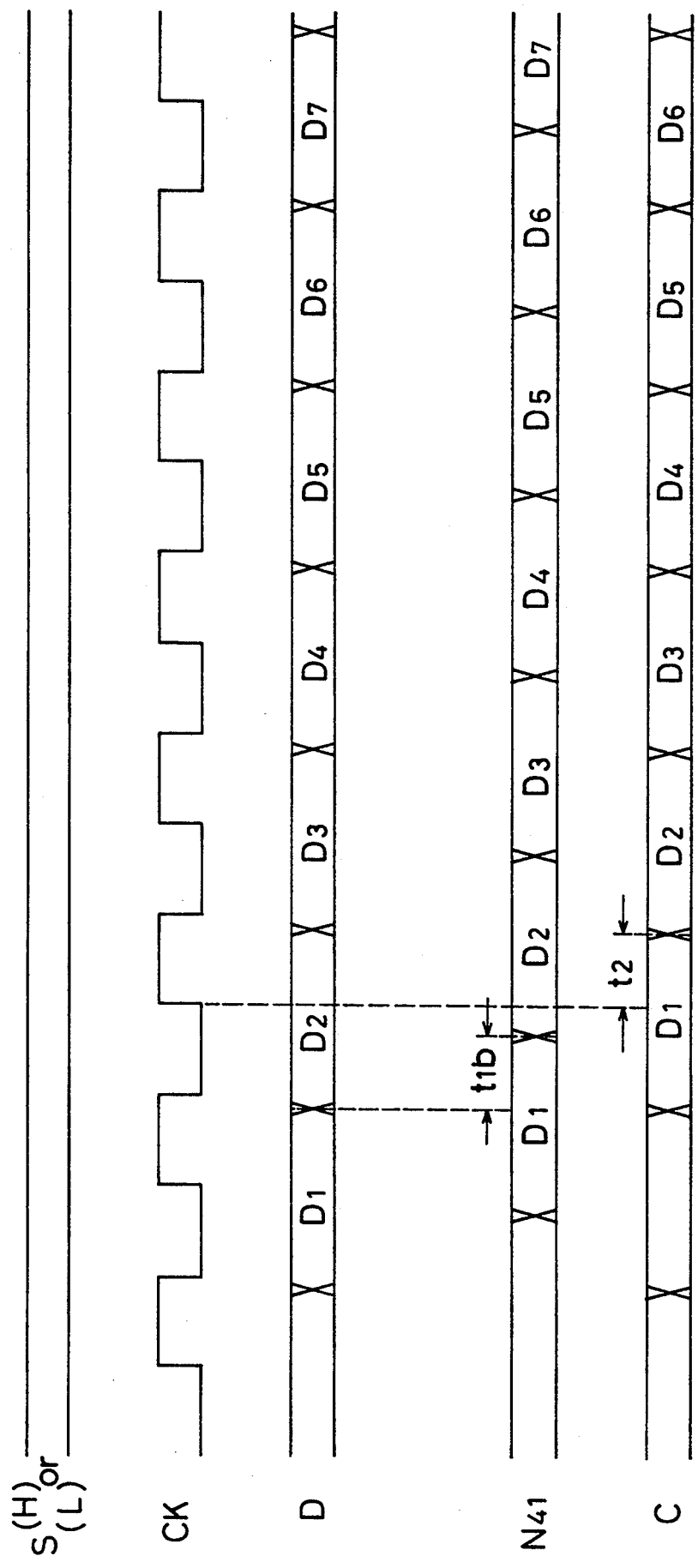
FIG. 4 is a waveform diagram for explaining the operation of the shift register circuit of FIG. 3.

When the four-bit shift register circuit of FIG. 5 is fabricated using three shift register circuits connected in series, the data at the node N41 is subjected to a delay caused by three NOR gates, i.e., one two-input NOR gate and two three-input NOR gates, so that the delay time of the whole circuit is reduced by the delay time of two NOR gates as compared with the conventional shift register circuit. Accordingly, the shift register circuit of this second embodiment normally operates if one-cycle (T) of the clock signal CK is longer than the sum of the delay time of four two-input NOR gates and two three-input NOR gates ($t_{1b}+t_2$), as shown in FIG. 4. In FIG. 4, reference character D designates the input data A or B.

In this embodiment, if it is supposed that the delay time of each two-input NOR gate is 50 ps and the delay time of each three-input NOR gate is 60 ps, the total delay time of the shift register circuit is 320 ps ($=50\times4+60\times2$). Therefore, the shift register circuit of this embodiment requires the cycle (T) of the clock signal CK be longer than 320 ps for normal operation, resulting in an increase in the operation speed by about 20 percent.

As is evident from the foregoing description, according to the present invention, when a data signal selected from two data signals is input to a flip-flop circuit synchronized with a clock signal and a reverse clock signal, a three-input NOR circuit is employed in placed of a plurality of two-input NOR circuits conventionally employed. Therefore, the number of gate circuits through which the input data signal travels is decreased, resulting in an increase in the operation speed of the shift register circuit.

In addition, since the three-input NOR circuit is employed, the total number of the NOR circuits included in the shift register circuit is decreased, resulting in a reduction in power consumption.

What is claimed is:

1. A shift register circuit comprising a selector circuit for selecting one of two input signals and a flip-flop circuit connected to said selector circuit and synchronized with a clock signal having a prescribed period, said flip-flop circuit for latching the selected signal, said selector circuit comprising:
   a first two-input NOR circuit to which a first data signal and a selection signal are input;
   a second two-input NOR circuit to which a first reverse data signal having an opposite phase from the first data signal and the selection signal are input;
   a third two-input NOR circuit to which a second data signal and a reverse selection signal having an opposite phase from the selection signal are input;
   a fourth two-input NOR circuit to which a second reverse data signal having an opposite phase from the second data signal and the reverse selection signal are input;
   a first three-input NOR circuit to which output signals from said first and third two-input NOR circuits and the clock signal are input; and
   a second three-input NOR circuit to which output signals from said second and fourth two-input NOR circuits and the clock signal are input.

2. A shift register circuit comprising a selector circuit for selecting one of two input signals and a flip-flop circuit connected to said selector circuit and synchronized with a clock signal having a prescribed period, said flip-flop circuit for latching the selected signal, said selector circuit comprising:

a first two-input NOR circuit to which a clock signal and a reverse selection signal having an opposite phase from a selection signal are input;

a first inverter to which an output signal from said first two-input NOR circuit is input;

a second two-input NOR circuit to which the clock signal and the selection signal are input;

a second inverter to which an output signal from said second two-input NOR circuit is input;

a third two-input NOR circuit to which a first data signal and an output signal from said first inverter are input;

an fourth two-input NOR circuit to which a first reverse data signal having an opposite phase from the first data signal and the output signal from said first inverter are input;

a fifth two-input NOR circuit to which a second data signal and an output signal from said second inverter are input;

a sixth two-input NOR circuit to which a second reverse data signal having an opposite phase from the second data signal and the output signal from said second inverter are input;

a first three-input NOR circuit to which output signals from said third and fifth two-input NOR circuits are input; and a second three-input NOR circuit to which output signals from said fourth and sixth two-input NOR circuits are input, an output from said first three-input NOR circuit being connected to an input of said second three-input NOR circuit and an output from said second three-input NOR circuit being connected to an input of said first three-input NOR circuit.

3. The shift register circuit of claim 1 wherein said flip-flop circuit is a master-slave flip-flop circuit including a master stage and said first and second three-input NOR circuits also serve as switching gates of the master stage of the master-slave flip-flop circuit.

4. The shift register circuit of claim 2 wherein said flip-flop circuit is a master-slave flip-flop circuit including a master stage and a slave stage and said first and second three-input NOR circuits also serve as switching gates of the master stage of the master-slave flip-flop circuit.

5. The shift register circuit of claim 4 comprising delay means for delaying a reverse clock signal having opposite phase from the clock signal and supplying the delayed reverse clock signal to a switching gate of said slave stage of said master-slave flip-flop circuit, the reverse clock signal being delayed by a time interval equivalent to a time the clock signal is delayed by one of (i) said first two-input NOR circuit and said first inverter and (ii) said second two-input NOR circuit and said second inverter.

* * * * *